United States Patent
Morii

(10) Patent No.: US 9,581,623 B2
(45) Date of Patent: Feb. 28, 2017

(54) BAND POWER COMPUTATION DEVICE AND BAND POWER COMPUTATION METHOD

(71) Applicant: PANASONIC INTELLECTUAL PROPERTY CORPORATION OF AMERICA, Torrance, CA (US)

(72) Inventor: Toshiyuki Morii, Kanagawa (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 412 days.

(21) Appl. No.: 14/386,523

(22) PCT Filed: Mar. 8, 2013

(86) PCT No.: PCT/JP2013/001486
§ 371 (c)(1),
(2) Date: Sep. 19, 2014

(87) PCT Pub. No.: WO2013/140733
PCT Pub. Date: Sep. 26, 2013

(65) Prior Publication Data
US 2015/0100258 A1    Apr. 9, 2015

(30) Foreign Application Priority Data
Mar. 23, 2012 (JP) ................. 2012-067913

(51) Int. Cl.
*G01R 21/00* (2006.01)
*G01R 15/00* (2006.01)
(Continued)

(52) U.S. Cl.
CPC ............ *G01R 21/006* (2013.01); *G10L 25/21* (2013.01); *G10L 25/18* (2013.01)

(58) Field of Classification Search
CPC ... G01R 21/006; G01R 22/063; G01R 21/133; G01R 31/088; G10L 25/21; G10L 25/18; G10L 21/038
(Continued)

(56) References Cited

U.S. PATENT DOCUMENTS 7,158,932 B1    1/2007  Furuta
8,433,582 B2 *  4/2013  Ramabadran ......... G10L 21/038
                                                     367/136
(Continued)

FOREIGN PATENT DOCUMENTS

JP    2001-134287    5/2001
JP    2005-202222    7/2005
(Continued)

OTHER PUBLICATIONS

Extended European Search Report, mailed May 19, 2015, by the European Patent Office in the corresponding European Patent Application.
(Continued)

*Primary Examiner* — An Do
(74) *Attorney, Agent, or Firm* — Greenblum & Bernstein, P.L.C.

(57) ABSTRACT

A band power computation device with which the amount of calculation required to compute channel power is reduced, and with which it is possible to obtain channel power with the same precision as when the channel power is obtained from the entire input signal. With this device, a subspace extraction unit (101) extracts a portion of the input signal. An FFT unit (104) performs a Fourier transformation on the extracted signal, generating a spectrum signal. A power computation unit (105) computes the channel power for each frequency from the spectrum signal. A power generation unit (150) expands the channel power to the same channel power (Continued)

as the channel power computed from the input signal, and smoothes the expanded channel power by performing a calculation sequentially from the highest frequency to the lowest frequency, said calculation using the expanded channel power and a prescribed constant.

6 Claims, 2 Drawing Sheets

(51) Int. Cl.
  *G10L 25/21* (2013.01)
  *G10L 25/18* (2013.01)
(58) Field of Classification Search
  USPC .................. 702/57, 60–62; 704/205–207
  See application file for complete search history.

(56) References Cited

U.S. PATENT DOCUMENTS

| | | | |
|---|---|---|---|
| 9,530,430 B2* | 12/2016 | Furuta | .............. G10L 21/0364 |
| 2009/0210224 A1 | 8/2009 | Fukuda et al. | |
| 2009/0322591 A1 | 12/2009 | Matsuoka | |

FOREIGN PATENT DOCUMENTS

| | | |
|---|---|---|
| JP | 2006-180354 | 7/2006 |
| JP | 2009-058708 | 3/2009 |
| JP | 2009-150707 | 7/2009 |
| JP | 2010-025972 | 2/2010 |

OTHER PUBLICATIONS

Sirko Molau et al., "Computing Mel-Frequency Cepstral Coefficients on the Power Spectrum", 2001 IEEE International Conference on Acoustics, Speech, and Signal Processing, Proceedings (ICASSP), vol. 1, pp. 73-76, XP010803088, May 7, 2001.
Saeed V. Vaseghi, "Interpolation", Advanced Digital Signal Processing and Noise Reduction, Second Edition, pp. 297-332, XP055187457, 2000.
"How do I interpolate between bins on an FFT?", Google Groups, XP055187439, Jun. 24, 1998.
Series G: Transmission Systems and Media, Digital Systems and Networks, "Frame error robust narrow-band and wideband embedded variable bit-rate coding of speech and audio from 8-32 kbit/s", ITU-T G.718, Jun. 2008.
International Search Report, mailed Jun. 18, 2013, in corresponding International Application No. PCT/JP2013/001486.

* cited by examiner

BAND POWER COMPUTATION DEVICE AND BAND POWER COMPUTATION METHOD

TECHNICAL FIELD

The present invention relates to a band power calculation apparatus and a band power calculation method.

BACKGROUND ART

In mobile communication, compression coding of digital information such as speech or image is indispensable for effective utilization of a transmission band. Among the compression coding techniques, there is a great expectation for a speech codec (coding/decoding) technique which is widely used for mobile phones, and there is a growing demand for higher sound quality in conventional high efficiency coding with a high compression rate. Since the speech codec technique is publicly used, its standardization is indispensable and because of the enormous impact of intellectual property involved, companies worldwide are actively engaged in research and development thereof. In recent years, ITU-T (International Telecommunication Union-Telecommunication Standardization Sector) or MPEG (Moving Picture Experts Group) have been studying standardization of codec that can encode both speech and music, and more efficient and higher quality speech codec is required.

Speech recognition techniques are being put to practical use, mainly targeted for mobile phones or car navigation systems. Many worldwide venture businesses are being integrated into a small number of companies after being merged repeatedly and their speech recognition techniques are being used for products of a variety of companies.

In speech codec among those techniques, standard codec (ITU-T G729.1, G.718) that encodes input signals of a variety of speech bands is being standardized in which after using a power spectrum in Fourier transform (FFT: Fast Fourier Transform) (hereinafter, described as "FFT"), band power is calculated and a band of an input signal is determined.

Furthermore, what is problematic in speech coding and speech recognition is "environment noise" and techniques for removing this are also being actively studied. Moreover, in addition to noise cancellation, studies on techniques of transforming an input signal into a spectrum through FFT to detect noise or the presence or absence of speech are also being carried forward. With an increase in the processing speed of processors, a method of accurately analyzing spectra through FFT has been adopted in recent years in addition to filter banks which are conventionally used and noise is being analyzed using band power obtained therefrom.

The technique of calculating band power of a spectrum using FFT is used for noise cancellation (also referred to as "noise canceller" or "noise suppressor"), determination of a speech band, detection of speech or speech recognition or the like.

NPL 1 is known as an example where such a technique is used to determine a band of an input signal in speech coding. In this example, an input signal is subjected to FFT, power spectra are obtained, which are then added up for a specified frequency, band power is thereby calculated and a band of the input signal is determined based on the value of the band power.

Furthermore, PTL 1 and PTL 2 are known as examples using such a technique to remove noise. In these examples, an input signal is subjected to FFT, noise is removed on a spectrum, the result is reflected in the spectrum, which is then transformed into an output signal using inverse FFT, and noise is thereby reduced. PTL 1 and PTL 2 are characterized by obtaining a spectrum using FFT, adding up power spectra, then obtaining band power and analyzing noise. This band power is a parameter capable of not only analyzing noise but also analyzing the presence or absence of noise and sound quality. Using FFT in this way can perform an analysis accurately.

CITATION LIST

Patent Literature

PTL 1
Japanese Patent Application Laid-Open No. 2001-134287
PTL 2
Japanese Patent Application Laid-Open No. 2005-202222

Non-Patent Literature

NPL 1
ITU-T Standard G.718 Specification (Sections 6.1.4 to 6.1.6)

SUMMARY OF INVENTION

Technical Problem

However, extensive studies have been carried out on methods of reducing the amount of calculation of FFT using conventional apparatuses, and when there is little room in the overall amount of calculation, the amount of calculation of FFT cannot be reduced, which will result in a problem in that the processing load associated with the calculation increases.

An object of the present invention is to provide a band power calculation apparatus and a band power calculation method capable of reducing the amount of calculation necessary to calculate channel power by extracting part of an input signal and applying Fourier transform thereto and also capable of obtaining channel power with accuracy similar to that obtained when calculating channel power from the whole input signal by extending and smoothing the channel power of the extracted signal.

Solution to Problem

A band power calculation apparatus according to an aspect of the present invention includes: an extraction section that extracts part of an input signal; a Fourier transform section that generates a spectrum signal by applying Fourier transform to the signal extracted by the extraction section; a calculation section that calculates channel power at each frequency from the spectrum signal generated by the Fourier transform section; a power generating section that extends the channel power calculated by the calculation section up to channel power equivalent to channel power calculated from the input signal, and sequentially performs calculations using the extended channel power and a predetermined constant from higher frequencies toward lower frequencies to perform smoothing of the extended channel power; and a band power acquiring section that adds up the channel power smoothed by the power generating section to acquire power in a predetermined band.

A band power calculation method according to an aspect of the present invention includes: extracting part of an input signal; generating a spectrum signal by applying Fourier transform to the extracted signal; calculating channel power at each frequency from the generated spectrum signal; extending the calculated channel power up to channel power equivalent to channel power calculated from the input signal, and sequentially performing calculations using the extended channel power and a predetermined constant from higher frequencies toward lower frequencies to perform smoothing of the extended channel power; and adding up the smoothed channel power to acquire power in a predetermined band.

Advantageous Effects of Invention

According to the present invention, it is possible to reduce the amount of calculation necessary to calculate channel power by extracting part of an input signal and applying Fourier transform thereto and also to obtain channel power with accuracy similar to that obtained when calculating channel power from the whole input signal by extending and smoothing the channel power of the extracted signal.

DESCRIPTION OF EMBODIMENT

How the Invention has been Developed

Focusing on the fact that when calculating band power, it is not necessary to perform Fourier transform with high accuracy to calculate channel power, the inventor of the present invention arrived at a more specific idea for calculating band power with similar accuracy using even some part of an input signal.

In this case, since channel power obtained by FFT on a partial segment of the input signal is shorter than channel power obtained by FFT on the whole segment of the input signal, it is necessary to extend the channel power to the level of channel power that is supposed to be outputted. As such a method, the inventor has suggested a method of extending the channel power using a plurality of values of channel power of the partial segment of the input signal, but it has been found that it would be impossible to obtain sufficient accuracy using that method. Thus, the inventor has suggested performing interpolation using a correlation between frequencies and suggested a method of adding channel power on a higher frequency side which has been extended from higher to lower frequencies and multiplied by a predetermined value (constant) to the extended channel power on a lower frequency side.

The inventor has invented a band power calculation apparatus of the present invention by combining the above-described ideas.

Hereinafter, an embodiment of the present invention will be described in detail with reference to the accompanying drawings.

Embodiment

<Configuration of Band Power Calculation Apparatus>

Figure 1:
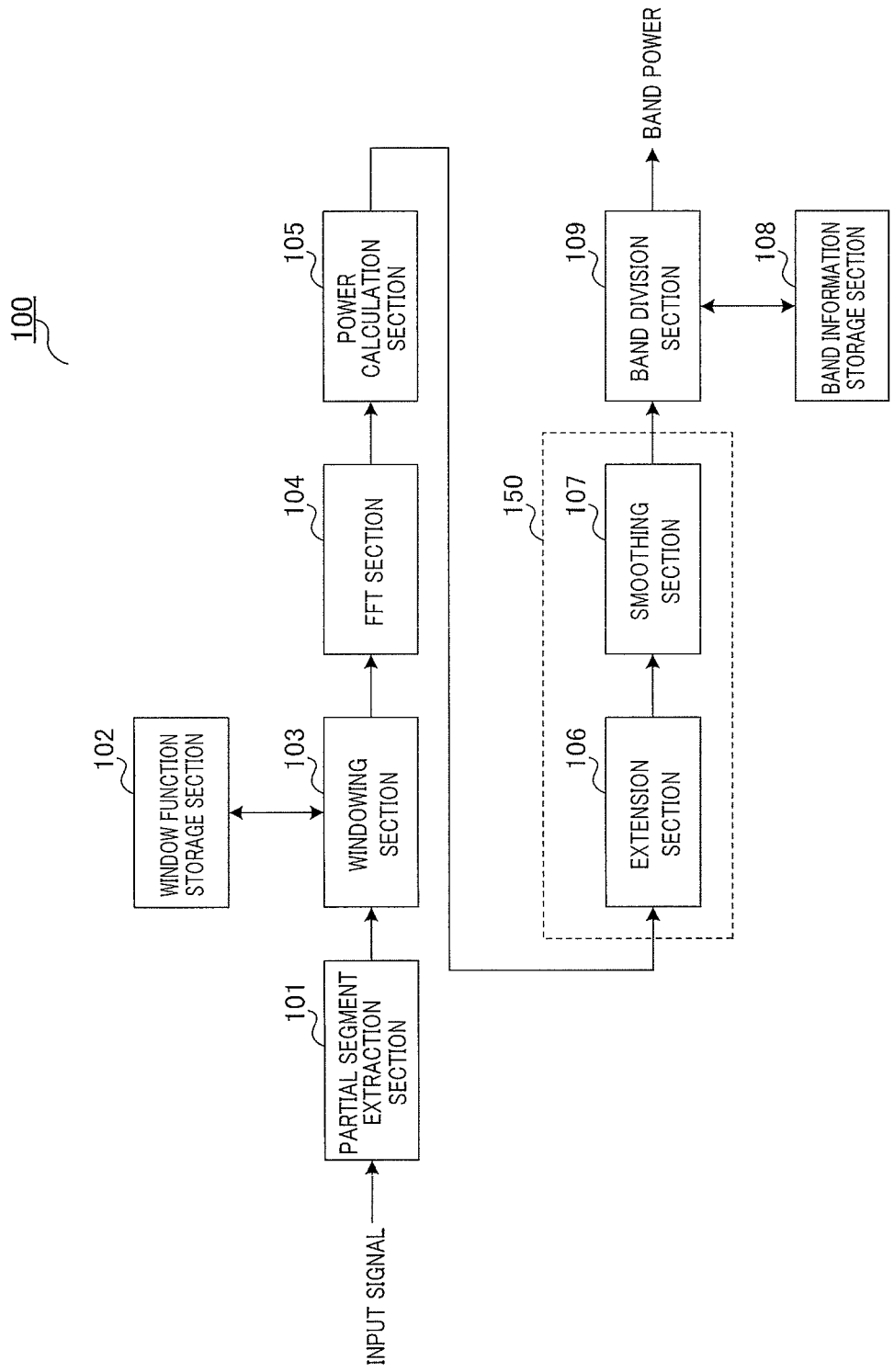
FIG. 1 is a block diagram illustrating a configuration of a band power calculation apparatus according to an embodiment of the present invention.

A configuration of band power calculation apparatus 100 according to an embodiment of the present invention will be described using FIG. 1. FIG. 1 is a block diagram illustrating the configuration of band power calculation apparatus 100 according to the present embodiment.

Band power calculation apparatus 100 is mainly configured of partial segment extraction section 101, window function storage section 102, windowing section 103, FFT section 104, power calculation section 105, extension section 106, smoothing section 107, band information storage section 108, and band division section 109. Power generating section 150 includes extension section 106 and smoothing section 107.

Partial segment extraction section 101 extracts part of an input signal. As an example, the present embodiment assumes the length of an input signal to be "256 samples" and the length of the extracted signal to be "128 samples" and assumes that the signal is extracted at a center of the segment of the input signal. That is, partial segment extraction section 101 extracts part of the input signal so that the center on the time axis of the input signal which is a time-domain signal coincides with the center on the time axis of the extracted signal. An extraction algorithm in this case is shown in Equation 1.

[1]

$$ps_i = s_{i+64} \quad i=0 \ldots 127 \tag{Equation 1}$$

where $s_i$ is an input signal, $ps_i$ is an extracted signal, and i is an index.

Partial segment extraction section 101 outputs the extracted signal to windowing section 103.

Window function storage section 102 stores a window function.

Windowing section 103 multiplies the extracted signal inputted from partial segment extraction section 101 by the window function stored in window function storage section 102. That is, windowing section 103 carries out a calculation shown in Equation 2.

[2]

$$wps_i = PW_i \cdot ps_i (i=0,1,2,\ldots,127) \tag{Equation 2}$$

where $wps_i$ is a windowed signal, $PW_i$ is a window function, and i is an index.

The present embodiment uses a Hanning window shown in Equation 3 as the window function.

[3]

$$PW_i = 0.50 + 0.50 \cdot \cos(2\pi \cdot j/128 + \pi) \tag{Equation 3}$$

where $PW_i$ is a window function, and i is an index.

Windowing section 103 multiplies the signal by a window function and output the windowed signal to FFT section 104.

FFT section 104 performs FFT on the windowed signal inputted from windowing section 103 and obtains a complex spectrum. That is, FFT section 104 performs processing of DFT (Discrete Fourier Transform) shown in Equation 4 at a high speed using an improved algorithm.

[4]

$$px_j = \sum_{i=0}^{127} \cos(p\omega \cdot i \cdot j) \cdot wps_i \qquad \text{(Equation 4)}$$

$$py_j = \sum_{i=0}^{127} \sin(p\omega \cdot i \cdot j) \cdot wps_i$$

where $wps_i$ is a windowed signal, $p\omega$ is an angle ($2\pi/128$), $px_i$ and $py_i$ are complex spectra, i is an index of the input signal, and j is a frequency index.

For example, let us suppose that the length of the input signal is "256" and the length of the extracted signal is "128," the order of FFT is "7." FFT section 104 outputs the determined complex spectrum to power calculation section 105.

Power calculation section 105 calculates channel power (channel power calculated from the extracted signal) of each frequency from the complex spectrum inputted from FFT section 104. More specifically, power calculation section 105 performs calculations in following Equation 5.

[5]

$$pp_j = px_j \cdot px_j + py_j \cdot py_j$$

$$j = 0, \ldots, 63 \qquad \text{(Equation 5)}$$

where, $pp_j$ is channel power calculated from the extracted signal, and j is a frequency index.

Since the channel power to be calculated is symmetric with respect to half the sampling frequency, power calculation section 105 actually only needs to calculate channel power of a band half the band of a complex spectrum inputted from FFT section 104. For example, when the length of the input signal is "256" and the length of the extracted signal is "128," power calculation section 105 calculates the channel power for a frequency of 64. Power calculation section 105 outputs the calculated channel power to extension section 106.

Extension section 106 extends the channel power (length of the spectrum) inputted from power calculation section 105. More specifically, since the length of the input signal is 256 and the length of the spectrum calculated from the signal of that length is 128, extension section 106 extends channel power by storing a plurality of pieces of one channel power for the frequency of 64 calculated from the extracted signal. That is, extension section 106 performs a calculation in Equation 6 below.

[6]

$$epp_{i \times 2 + j} = pp_i \quad i = 0 \ldots 63 \; j = 0,1 \qquad \text{(Equation 6)}$$

where $epp_i$ is extended channel power, and i,j are indices.

Extension section 106 extends the channel power to a level equivalent to the level of channel power calculated without extracting the input signal according to equation 6 and outputs the extended channel power to smoothing section 107.

Smoothing section 107 applies an AR filter to the extended channel power inputted from extension section 106 to thereby perform smoothing. More specifically, smoothing section 107 performs smoothing on the extended channel power from higher frequencies toward lower frequencies by adding the extended channel power on the higher frequency side multiplied by a predetermined value (constant) to the extended channel power on the lower frequency side. That is, smoothing section 107 performs a calculation in Equation 7 below.

[7]

$$\begin{cases} cp_{127} = epp_{127} \\ cp_i = epp_i + 0.37 \cdot cp_{i+1} \quad i = 126, 125, \ldots, 0 \end{cases} \qquad \text{(Equation 7)}$$

where $cp_i$ is channel power as the output.

Smoothing section 107 outputs the smoothed channel power to band division section 109.

Band information storage section 108 stores beforehand, information on a band to which channel power values are added and integrated (information on start and end points indicating a range of frequencies over which each band extends).

As shown in Equation 8, band division section 109 adds up channel power inputted from smoothing section 107 to obtain band power to be added and integrated, indicated by the information acquired from band information storage section 108.

[8]

$$bp_k = \sum_{j=Start(k)}^{End(k)} p_j \qquad \text{(Equation 8)}$$

$$k = 0, \ldots, \text{Band}$$

where $bp_k$ is band power, k is an index of the band, Start(k), End(k) are frequencies at start and end points of band k stored in band information storage section 108, and Band is the number of bands.

As described above, the band power is obtained from an input signal. This band power is used as a parameter indicating the presence or absence of noise and magnitude thereof, the presence or absence of speech or magnitude thereof or the like.

Note that regarding how to use band power which is the output of band division section 109, PTL 1, PTL 2 and NPL 1 describe cases where the band power is used to determine a speech band or for noise cancellation. Here, in these documents, application such as visually showing noise analysis results based on band power without reflecting outputs of determination of a speech band or noise cancellation in a complex spectrum can be easily inferred from analogy. In such a case, inverse FFT (IFFT: Inverse Fast Fourier Transform) is unnecessary and the power spectrum itself even need not be stored. Moreover, it is also possible to analyze, based on this band power, on which frequency band of the input signal, sound is concentrated. Sound concentration can be clearly determined from the magnitude of band power by detecting a case where signals are less frequently found in a high frequency band or the like. As a substitute for a spectrogram, continuous band power may also be used. Therefore, it is obvious that the present embodiment is also applicable to speech recognition or speaker recognition.

<Variation of Extension and Smoothing Processing>

Figure 2:
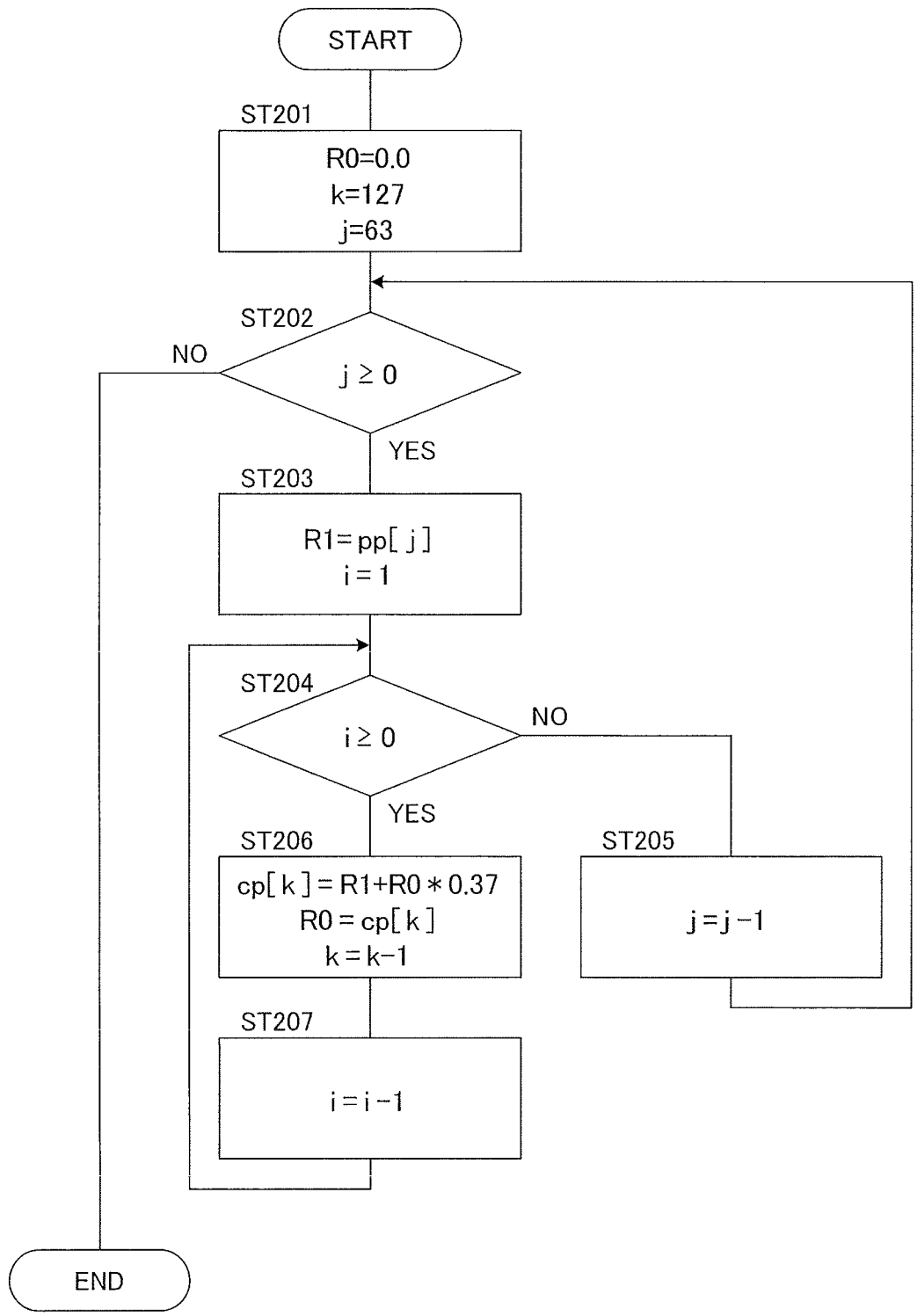
FIG. 2 is a flowchart illustrating a variation of extension and smoothing processing in the embodiment of the present invention.

A variation of the above-described processing in extension section 106 and smoothing section 107 in the embodiment of the present invention will be described with reference to FIG. 2. FIG. 2 is a flowchart illustrating the variation of the extension and smoothing processing of the present embodiment.

The above-described processing of extension section 106 and smoothing section 107 can be performed through calculations within single double loop in power generating section 150 as shown in Equation 9.

[9]
$$\begin{cases} cp_{128} = 0 \\ cp_{j \times 2+i} = pp_j + 0.37 \cdot cp_{j \times 2+i+1} \quad j = 63 \ldots 0 \quad i = 1, 0 \end{cases} \quad \text{(Equation 9)}$$

More specifically, from FIG. 2, power generating section 150 sets R0 indicating channel power to "0.0," sets index k of the extended frequency to "127" and sets index j of the frequency before extension to "63" (step ST201).

Next, power generating section 150 determines whether or not j is equal to "0" or greater (step ST202).

Upon determining that j is less than "0" (step ST202: NO), power generating section 150 ends the processing.

On the other hand, upon determining that j is equal to "0" or greater (step ST202: YES), power generating section 150 sets the channel power of the extracted signal inputted from power calculation section 105 as the value of R1 (step ST203).

Power generating section 150 also sets "1" in index "i" (step ST203).

Next, power generating section 150 determines whether or not the value of "i" is "0" or greater (step ST204).

Upon determining that the value of "i" is less than "0" (step ST204: NO), power generating section 150 subtracts "1" from the value of j (step ST205) and returns the process to step ST202.

On the other hand, upon determining that the value of "i" is "0" or greater (step ST204: YES), power generating section 150 extends and smooths the channel power inputted from power calculation section 105. More specifically, power generating section 150 multiplies the channel power inputted from power calculation section 105 this time by 0.37 which is a predetermined constant to obtain a multiplication result, adds up the channel power inputted from power calculation section 105 this time and the multiplication result to obtain smoothed channel power (step ST206).

Power generating section 150 subtracts "1" from the value of k (step ST206).

Next, power generating section 150 subtracts "1" from the value of "i" (step ST207) and returns the process to step ST204. Power generating section 150 repeats the processes from step ST204→step ST206→step ST207 twice, that is, by using R1 which is channel power twice within the loop of i, and thereby extends the channel power.

<Experiment Result>

In order to verify the performance of the present embodiment, an experiment using speech data was conducted, the result of which will be reported.

In the present experiment, band power was analyzed and a bandwidth of speech was recognized. In this experiment, the conventional case where band power is calculated using a power spectrum obtained by applying FFT to the whole input signal was compared with a case where band power is calculated in the present invention about the amount of calculation and recognition performance. A sampling rate of the input signal is 48 kHz, a frame length is 256, and a segment length is 128. Data linking Japanese speech data of approximately 4 seconds each for eight men and women was used as evaluation data. This linked data was created so that four bands: up to 3.4 kHz, up to 7 kHz, up to 14 kHz and without limitation, would appear in turn at some midpoint. As a result of the experiment, the present invention showed an amount of calculation smaller by 1.5 WMOPS (weighted million operations per second) than the related art. The difference in the recognition result between the related art and the present invention is only 2.4%. The experiment has proven that the present invention can drastically reduce the amount of calculation without changing performance compared to the related art.

<Effects of Present Embodiment>

The present embodiment extracts part of an input signal, applies Fourier transform to the extracted signal, and can thereby reduce the amount of calculation necessary to calculate channel power, and also extends' and smooths power of the extracted signal, and can thereby obtain channel power with accuracy similar to the case where channel power is calculated from the whole input signal.

According to the present embodiment, when channel power is extended and smoothing processing on the extended channel power is calculated within single double loop, it is possible to eliminate the necessity for memory $epp_j$ in which the extended channel power is stored, and thereby to save the memory capacity.

According to the present embodiment, an extracted signal with a small number of samples is multiplied by a window function, and it is thereby possible to make a stable frequency analysis even when the number of samples is small.

According to the present embodiment, part of an input signal is extracted so that the center on the time axis of an input signal which is a time-domain signal coincides with the center on the time axis of the extracted signal, and when making a frequency analysis using the extracted signal, it is thereby possible to make a frequency analysis that represents the input signal and to obtain band power with high accuracy.

According to the present embodiment, when a Hanning window is used for the window function, the end points of the extracted signal become "0" and a more stable frequency analysis can be made.

According to the present embodiment, it is possible to perform Fourier transform with a smaller order than that in the case where Fourier transform is performed without extracting any input signal to acquire band power, and thereby reduce the amount of calculation.

<Variation of Present Embodiment>

In the above-described embodiment, the length of the input signal is assumed to be 256, but the present invention is not limited to this, and the length may be 512 or 1024 or the like, and even when the length of 512 or 1024 is adopted, great effects similar to those of the present embodiment can be obtained. In this case, the length of the input signal is not limited to 2 to the power of a number, but can be set to any given length such as 200 or 300. When the length of the input signal is set to 200 or 300, the length of the signal that is subjected to FFT increases, and therefore the effect of the reduction in the amount of calculation becomes greater.

In the above-described embodiment, the length of the extracted signal is assumed to be 128, but the present invention is not limited to this, and the length of the extracted signal may be 64 or 32. In this case, the length of the extracted signal need not be a length corresponding to 2 to the power of a number. Decreasing the length of the extracted signal may degrade performance but the degree of the reduction in the amount of calculation increases. The length of the extracted signal can be set according to the use or purpose.

In the above-described embodiment, the center of the extracted signal is made to coincide with the center of the input signal, but the present invention is not limited to this, and the center of the extracted signal may not coincide with the center of the input signal. However, experiments have proven that it is preferable to make the center of the extracted signal coincide with the center of the input signal.

In the above-described embodiment, the constant used for smoothing is assumed to be 0.37, but the present invention is not limited to this, and any numerical value other than 0.37 may also be used. The greater the constant is, the more stable the performance will be. However, the followability to a change in the band becomes slower and the performance degrades. However, when the constant is small, it has been proven that effects of smoothing are hardly reflected and performance still tends to degrade. When the band power calculation apparatus is put to practical use, the design of the apparatus needs to be followed by a design procedure whereby this constant is finally adjusted. The constant may be changed according to the length of segment at which an input signal is extracted. In this case, a plurality of constants may be stored beforehand and a constant may be adaptively selected according to the length of the segment during which an input signal is extracted.

In the above-described embodiment, smoothing is performed while applying an AR filter, but the present invention is not limited to this, and smoothing may be performed using a method other than applying the AR filter.

It is obvious that the present embodiment is also applicable to speech recognition, synthesis or speech coding, or image recognition or image coding or the like. This is because, the present invention is intended to calculate band power and does not depend on an object of the entire system that uses the band power.

The disclosure of the specification, drawings, and abstract included in Japanese Patent Application No. 2012-067913 filed on Mar. 23, 2012 is incorporated herein by reference in its entirety.

INDUSTRIAL APPLICABILITY

The present invention is suitable for a band power calculation apparatus and a band power calculation method.

REFERENCE SIGNS LIST

100 Band power calculation apparatus
101 Partial segment extraction section
102 Window function storage section
103 Windowing section
104 FFT section
105 Power calculation section
106 Extension section
107 Smoothing section
108 Band information storage section
109 Band division section
150 Power generating section

The invention claimed is:

1. A band power calculation apparatus comprising:
an extraction section that extracts part of an input signal;
a Fourier transform section that generates a spectrum signal by applying Fourier transform to the signal extracted by the extraction section;
a calculation section that calculates channel power at each frequency from the spectrum signal generated by the Fourier transform section;
a power generating section that extends the channel power calculated by the calculation section up to channel power equivalent to channel power calculated from the input signal, and sequentially performs calculations using the extended channel power and a predetermined constant from higher frequencies toward lower frequencies to perform smoothing of the extended channel power; and
a band power acquiring section that adds up the channel power smoothed by the power generating section to acquire power in a predetermined band.

2. The band power calculation apparatus according to claim 1, wherein the extraction section extracts part of the input signal so that a center on a time axis of the input signal that is a time-domain signal coincides with a center on a time axis of the extracted signal.

3. The band power calculation apparatus according to claim 1, further comprising a windowing section that multiplies the signal extracted by the extraction section by a Hanning window, wherein
the Fourier transform section performs Fourier transform on a signal resulting from multiplying the extracted signal by the Hanning window by the windowing section.

4. The band power calculation apparatus according to claim 1, wherein the Fourier transform section performs Fourier transform on the extracted signal with a smaller order than that used when Fourier transform is performed without extracting the input signal to acquire power in the predetermined band.

5. The band power calculation apparatus according to claim 1, wherein the power generating section performs the extension and the smoothing for each predetermined band of the spectrum signal.

6. A band power calculation method comprising:
extracting part of an input signal;
generating a spectrum signal by applying Fourier transform to the extracted signal;
calculating channel power at each frequency from the generated spectrum signal;
extending the calculated channel power up to channel power equivalent to channel power calculated from the input signal, and sequentially performing calculations using the extended channel power and a predetermined constant from higher frequencies toward lower frequencies to perform smoothing of the extended channel power; and
adding up the smoothed channel power to acquire power in a predetermined band.

* * * * *